United States Patent
Alam et al.

(10) Patent No.: US 12,334,488 B2
(45) Date of Patent: Jun. 17, 2025

(54) STACKING POWER DELIVERY DEVICE DIES

(71) Applicants: ADVANCED MICRO DEVICES, INC., Santa Clara, CA (US); ATI TECHNOLOGIES ULC, Markham (CA)

(72) Inventors: Arsalan Alam, Austin, TX (US); Fei Guo, Markham (CA); Rahul Agarwal, Santa Clara, CA (US)

(73) Assignees: ADVANCED MICRO DEVICES, INC., Santa Clara, CA (US); ATI TECHNOLOGIES ULC, Markham (CA)

( * ) Notice: Subject to any disclaimer, the term of this patent is extended or adjusted under 35 U.S.C. 154(b) by 315 days.

(21) Appl. No.: 17/564,123

(22) Filed: Dec. 28, 2021

(65) Prior Publication Data

US 2023/0207546 A1    Jun. 29, 2023

(51) Int. Cl.
| | |
|---|---|
| *H01L 25/065* | (2023.01) |
| *H01L 21/56* | (2006.01) |
| *H01L 25/00* | (2006.01) |
| *H01L 25/10* | (2006.01) |
| *H01L 25/18* | (2023.01) |
| *H01L 23/00* | (2006.01) |

(52) U.S. Cl.
CPC ............ *H01L 25/18* (2013.01); *H01L 21/56* (2013.01); *H01L 25/0652* (2013.01); *H01L 25/105* (2013.01); *H01L 25/50* (2013.01); *H01L 24/05* (2013.01); *H01L 24/06* (2013.01); *H01L 24/08* (2013.01); *H01L 24/80* (2013.01); *H01L 2224/0557* (2013.01); *H01L 2224/06181* (2013.01); *H01L 2224/08145* (2013.01); *H01L 2224/80379* (2013.01); *H01L 2224/80986* (2013.01); *H01L 2225/1058* (2013.01); *H01L 2924/059* (2013.01)

(58) Field of Classification Search
CPC ..... H01L 25/18; H01L 21/56; H01L 25/0652; H01L 25/105; H01L 24/06; H01L 24/80; H01L 24/05; H01L 2224/0557; H01L 2224/08145; H01L 2224/80379
See application file for complete search history.

(56) References Cited

U.S. PATENT DOCUMENTS

| | | | |
|---|---|---|---|
| 2015/0048500 A1* | 2/2015 | Yu ........................... | H01L 24/14 257/737 |
| 2019/0013301 A1* | 1/2019 | Cheah ................. | H01L 21/6836 |
| 2019/0051642 A1* | 2/2019 | Gupta Hyde ......... | G06F 1/3296 |
| 2022/0310577 A1* | 9/2022 | Lee ..................... | H01L 25/0652 |
| 2023/0081139 A1* | 3/2023 | Valavala ............... | H01L 25/105 257/776 |
| 2023/0197563 A1* | 6/2023 | Agarwal ................ | H10B 12/50 257/712 |

\* cited by examiner

*Primary Examiner* — Thanh Y. Tran

(57) ABSTRACT

A semiconductor device includes a power delivery device die stack including a plurality of vertically arranged power delivery device dies. The plurality of power delivery device dies including at least a first power delivery device die and a second power delivery device die electrically connected to the first power delivery device die. The semiconductor device includes at least one external interconnect for providing a power input to the power delivery device die stack and at least one external interconnect for supplying a power output from the power delivery device die stack.

20 Claims, 15 Drawing Sheets

STACKING POWER DELIVERY DEVICE DIES

BACKGROUND

Packaged integrated circuits typically include a semiconductor chip mounted on a carrier substrate. The carrier substrate is configured to mount to a printed circuit board, such as a motherboard or card. The typical conventional carrier substrate includes an interconnect system that is made up of multiple layers of conductor planes or traces tied vertically by plural vias. Input/output pads on the die side of the carrier substrate connect to the die and input/output pads on the underside of the carrier substrate connect to the printed circuit board. A ball grid array, a land grid array, or pin grid array is used to electrically connect the underside input/output pads to the printed circuit board.

In packaged integrated circuits, power is normally delivered to integrated circuits via a power supply and some form of power delivery network. Although currently-available power supplies are designed to supply stable voltages, the actual power delivered to integrated circuits can contain significant amounts of noise and voltage fluctuations. Such noise and voltage fluctuations can be caused by other devices coupled to the power supply, high speed switching, electromagnetic interference and other causes.

Power delivery devices, such as voltage regulators and/or passive devices, optimize the power delivered to the integrated circuit by decoupling the integrated circuit from the power supply and filtering noise. A voltage regulator can include active logic that controls the optimization of power delivery through one or more passive devices, which may or may not be integrated in a package with the passive devices. Passive devices can include capacitors, inductors, resistors, and other passive components. To minimize parasitic capacitance and inductance, the power delivery device should be placed as close to the integrated circuit as possible. This can include integrating the power delivery device into the package. However, this can also increase the size of the floorplan of the package. Although it may be advantageous to include multiple power delivery devices in the package, it is not desirable to increase the size of the floorplan by integrating multiple power delivery devices within the package.

DETAILED DESCRIPTION

Figure 1:
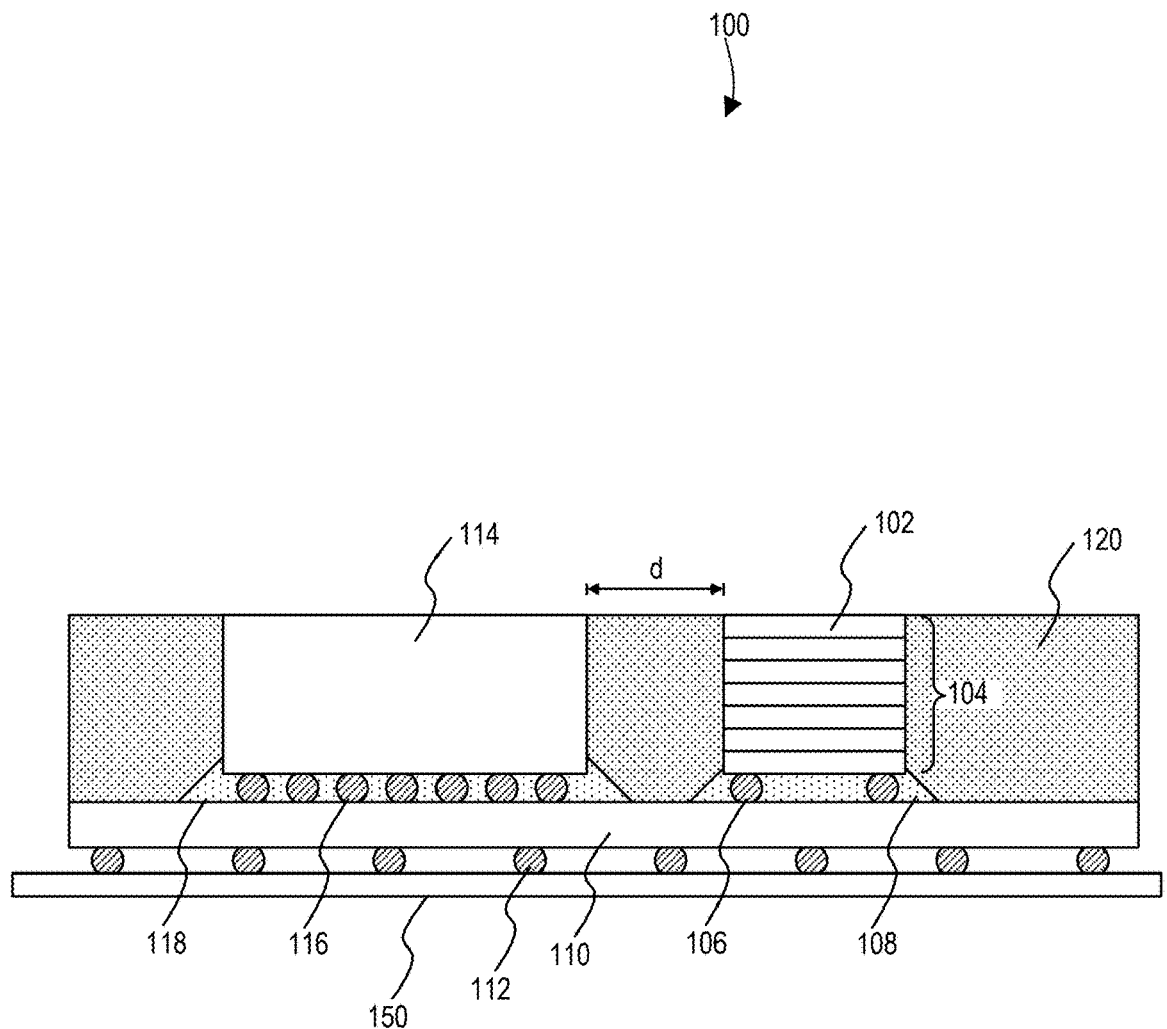
FIG. 1 sets forth a cross section block diagram of an example three-dimensional semiconductor package having a power delivery device die stack according to some implementations of the present disclosure.

To minimize the footprint of multiple power delivery devices integrated within the package, the present disclosure is directed to stacking package integrated power delivery devices. In various examples, the integrated power delivery devices can include package integrated voltage regulator (PIVR) dies and/or integrated passive device (IPD) dies such as capacitors, resistors, and inductors. In various implementations, PIVR dies and/or IPD dies can be stacked and interconnected using packaging techniques such as hybrid bonding, micro-bumping, thermal compression bonding, fan out wafer level packaging, flip chip, wire bonding, and so on. In one implementation, adjacent PIVR dies and/or IPD dies within the stack are bonded through a hybrid bonding technique and interconnected using through-silicon vias embedded in at least of the stacked dies. In another implementation, PIVR dies and/or IPD dies are diced and reconstituted on a wafer in a mold layer, where through-mold vias provide, in part, the interconnection of the stacked dies. In various implementations, the PIVR dies and/or IPD dies include multiple passive devices per die. In these implementations, a circuit within the power delivery device stack can include multiple passive devices disposed on different dies within the die stack.

An embodiment is directed to a semiconductor device for three-dimensional stacking of power delivery devices. The power delivery device die stack includes a plurality of vertically arranged power delivery device dies, where the plurality of power delivery device dies including at least a first power delivery device die and a second power delivery device die electrically connected to the first power delivery device die. The semiconductor device also includes at least one first external interconnect for providing a power input to the power delivery device die stack and at least one second external interconnect for supplying a power output from the power delivery device die stack. The first power delivery device die can be a package integrated voltage regulator die, a voltage regulator die, an integrated capacitor die, an integrated inductor die, or an integrated resistor die. The second power delivery device die can also be a package integrated voltage regulator die, a voltage regulator die, an integrated capacitor die, an integrated inductor die, or an integrated resistor die. In some examples, the power delivery device die stack includes voltage regulation logic.

In some implementations, the first power delivery device die includes a first plurality of passive devices and the second power delivery device die includes a second plurality of passive devices, where one or more of the first plurality of passive devices is electrically connected to one or more of the second plurality of passive devices.

In some implementations, the second power delivery device die is mounted directly on the first power delivery device die. In these implementations, the first power delivery device die and the second power delivery device die are mechanically and electrically connected through a hybrid metal and insulating bond. In some examples, the first power delivery device die includes through-silicon vias.

In some implementations, the first power delivery device die is included in a first power delivery device package having a redistribution layer fabricated on a first surface, where the redistribution layer including a plurality of conductor pads. In these implementations, the second power delivery device die is included in a second power delivery device package mounted on the first power delivery device package, where the second power delivery device package having a plurality of external conductive bumps metallurgically bonded to the plurality of conductor pads.

Another variation of the embodiment is directed to semiconductor package that includes an interposer, a logic die coupled to the interposer, and a power delivery device die stack electrically connected to logic die, where the power delivery device die stack includes at least a first power delivery device die and a second power delivery device die. The package also include a mold layer at least partially encapsulating the logic die and the power delivery device die stack.

In some implementations, the power delivery device die stack is coupled to the interposer. In other implementations, the power delivery device die stack is mounted on the logic die. In still further implementations, the power delivery device die stack is coupled to a carrier upon which the interposer is mounted.

In some implementations, the first power delivery device die and the second power delivery device die are both integrated passive device dies. In other implementations, the first power delivery device die is a package integrated voltage regulator including multiple passive devices and the second power delivery device die is an integrated passive device die. In still other implementations, the first power delivery device die is a voltage regulator and the second power delivery device die is an integrated passive device die. In some examples, one or more integrated passive device dies are stacked on the second power delivery device die.

In some implementations, the second power delivery device die is mounted on the first power delivery device die, and the first power delivery device die and the second power delivery device die are mechanically and electrically connected through a hybrid metal and insulating bond. In these implementations, the first power delivery device die includes through-silicon vias.

Another variation of the embodiment is directed to a method of fabricating a power delivery device die stack. The method includes placing a second power delivery device die over a first power delivery device die and establishing an electrical pathway between one or more passive devices in the first power delivery device die and one or more passive devices in the second power delivery device die. In some implementations, the method also includes placing a third power delivery device die over the second power delivery device die and establishing an electrical pathway between the first power delivery device die, the second power delivery device die, and the third power delivery device die. In some implementations, the electrical pathway includes at least one passive device in the first power delivery die and at least one passive device in the second power delivery die. The first power delivery device die can be a package integrated voltage regulator die, a voltage regulator die, an integrated capacitor die, an integrated inductor die, or an integrated resistor die. The second power delivery device die can be a package integrated voltage regulator die, a voltage regulator die, an integrated capacitor die, an integrated inductor die, or an integrated resistor die.

Another variation of the embodiment is directed to a method of using a power delivery device die stack. The method includes connecting a power delivery device die stack to a logic die, where the power delivery device die stack includes at least a first power delivery device die and a second power delivery device die mounted over the power delivery device die. The method also includes providing power to the power delivery device stack and supplying power from the power delivery device to the logic die.

In some examples, a circuit in the power delivery device stack supplying power to the logic die includes one or more passive devices in the first power delivery device die and one or more passive devices in the power delivery device die.

In some implementations, the power delivery device die is mounted on the first power delivery device and the first passive device die and the second power delivery device die are mechanically and electrically connected through a hybrid metal and insulating bond. In some examples the first power delivery device includes through-silicon vias providing an interconnection of the first power delivery device die and the second power delivery device die.

Embodiments in accordance with the present disclosure will be described in further detail beginning with FIG. 1. Like reference numerals refer to like elements throughout the specification and drawings. FIG. 1 sets forth a block diagram of an example semiconductor package 100 in accordance with some implementations of the present disclosure. Embodiments of the semiconductor package 100 can be useful in high performance applications, such as, for example, a personal computer, a notebook, a tablet, a smart phone, a storage data center, or applications involving large scale databases and/or analytics, such as finance, life sciences, and/or artificial intelligence. Many other applications are possible.

FIG. 1 depicts a sectional view of the example semiconductor package 100 that includes an integrated power delivery device die stack 104 in accordance with some embodiments of the present disclosure. The semiconductor package 100 includes a logic die 114, such as a system-on-chip die, coupled to an interposer 110 via multiple interconnects 116. An underfill material 118 is deposited around the interconnects 116 between the logic die 114 and the interposer 110. A power delivery device die stack 104 is also coupled to the interposer 110 via multiple interconnects 106. An underfill material 108 is deposited around the interconnects 106 between the power delivery device die stack 104 and the interposer 110. The logic die 114 and power delivery device die stack 104 are encased in a mold material 120 such as an epoxy resin. External package interconnects 112 are attached to the interposer for mounting to a carrier 150 to provide routing for power and ground from the carrier 150 to the power delivery device die stack 104 and the logic die 114, and to provide routing for input/output signals to/from the logic die 114. In some implementations, the power delivery device die stack 104 provides a supply of power to the logic die 114 through a connection layer in the interposer 110. In some examples, the distance d between the passive device stack 104 and the logic die 114 is selected to be less than 100 micrometers to improve electrical performance. In some examples, the carrier 150 can be a substrate or printed circuit board.

In an example alternative implementation, not depicted, the power delivery device die stack 104 is stacked on the logic die 114. For example, the interconnects 106 of the power delivery device die stack 104 can be connected to through-silicon vias (not depicted) in the logic die. In another example alternative implementation, the power delivery device die stack 104 is provided on the carrier 150 and is electrically coupled to the logic die 114 through package interconnects 112 and the interposer 110.

The power delivery device die stack 104 includes multiple power delivery device dies 102 stacked one-on-one in a vertical arrangement. In various implementations, a power delivery device die 102 can be a PIVR die that include passive devices, a voltage regulator die that does not include passive devices, or an integrated passive device die that can include multiple passive devices such as capacitors, resistors, inductors, or combinations thereof. In some examples, the power delivery device die stack 104 can include a mixture of PIVR dies and integrated passive device dies or a mixture of voltage regulator dies and integrated passive device dies. In one example, the power delivery device die stack 104 includes two or more stacked integrated passive devices. In another example, the power delivery device die stack 104 includes one or more integrated passive device dies that are stacked on one or more PIVR dies that also include passive devices, such that each die 102 in the stack 104 is stacked one-on-one. In yet another example, the power delivery device die stack 104 includes one or more integrated passive device dies that are stacked on one or more voltage regulator dies that do not include passive devices, such that each die 102 in the stack 104 is stacked one-on-one. As will be described in more detail below, each power delivery device die 102 can include multiple passive devices, which may correspond to intellectual property (IP) blocks or nets. In such examples, the individual passive devices in the power delivery device dies 102 can be connected within the die and across different levels of the power delivery device die stack 104.

Figure 2:
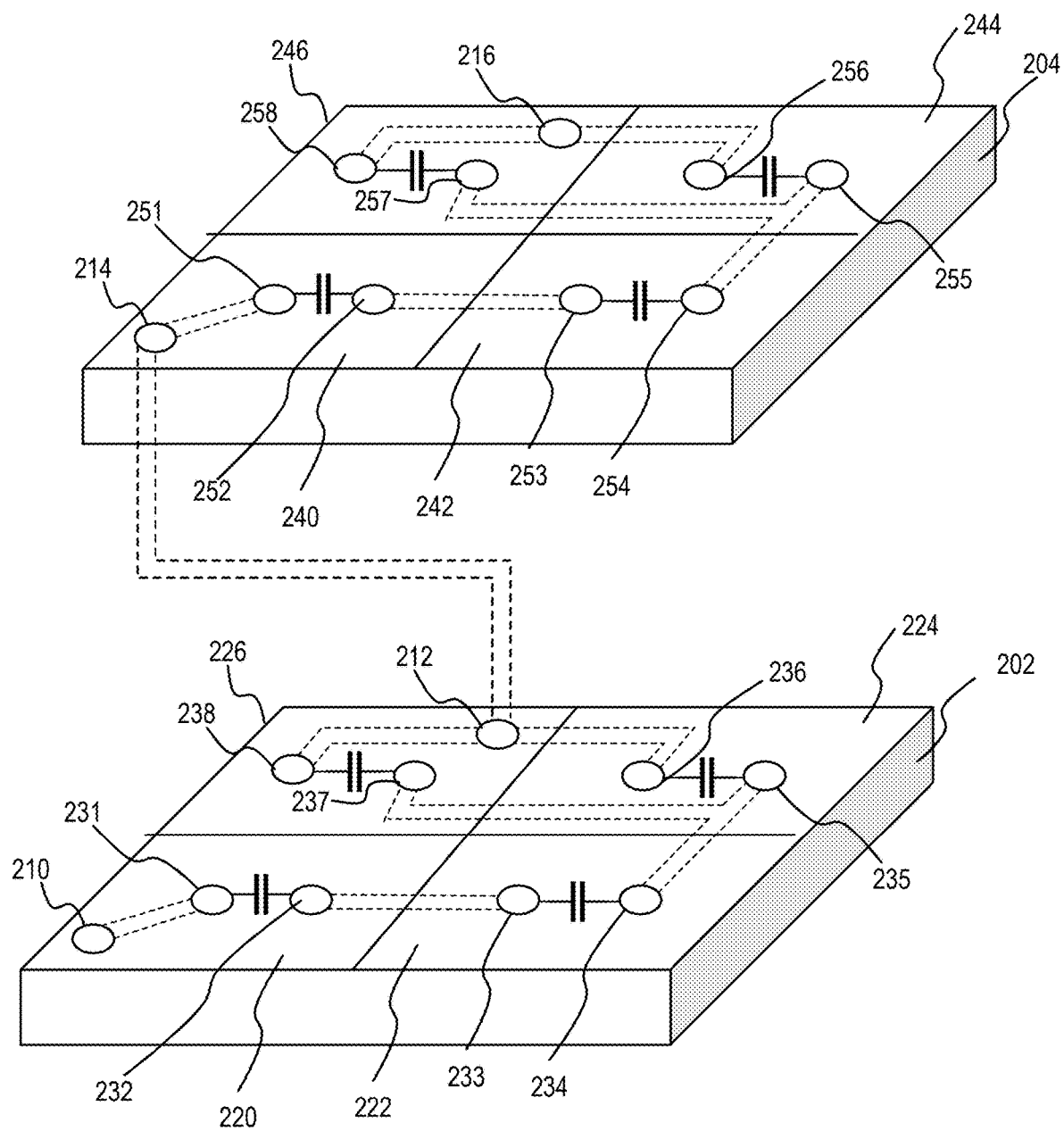
FIG. 2 sets forth example dies of a three-dimensional semiconductor package having a power delivery device die stack according to some implementations of the present disclosure.

For further explanation, FIG. 2 depicts a perspective view of the terminal side (i.e., front side or face) of two passive device dies 202, 204 of an integrated passive device die stack, which can be the power delivery device die stack 104 of FIG. 1, in accordance with some embodiments of the present disclosure. For the purpose of explanation, the passive device dies in FIG. 2 include two silicon capacitor dies 202 and 204. However, it should be appreciated that the following description can apply to other passive devices such as inductors or resistors.

In some examples, each capacitor die 202, 204 includes multiple capacitors. For example, the silicon capacitor die 202 can include four capacitors 220, 222, 224, 226, each having a respective input terminal 231, 233, 235, 237 and a respective output terminal 232, 234, 236, 238. Similarly, in this example, the silicon capacitor die 204 can include four capacitors 240, 242, 244, 246 each having a respective input terminal 251, 253, 255, 257 and a respective output terminal 252, 254, 256, 258. However, it will be appreciated that a particular capacitor die can include more or fewer capacitors and more or fewer terminals. Within a particular capacitor die, capacitors can be connected with each other, in series or parallel. Routing from between capacitor terminals can be provided by an interconnection layer, which may be a wafer fabricated back end of line (BEOL) structure or a fabricated redistribution layer structure. FIG. 2 depicts routing among capacitor terminals in the interconnection layer in broken lines.

Consider an example, as depicted in FIG. 2, where power is supplied to the capacitor 220 from a power input terminal 210. The capacitor 220 supplies power in series to capacitor 222, which supplies power in parallel to the capacitors 224, 226, whose output converges on a power output terminal 212. In this example, power is supplied to the capacitor 240 from a power input terminal 214. The capacitor 240 supplies power in series to capacitor 242, which supplies power in parallel to the capacitors 244, 246, whose output converges on a power output terminal 216. Consider another example, not depicted, in which the respective input terminals 231, 233, 235, 237 of the capacitors 220, 222, 224, 226 on die 202 are connected in parallel to the power input terminal 210, and the respective output terminals 232, 234, 236, 238 of the capacitors 220, 222, 224, 226 are connected in parallel to the power output terminal 212. In this example, the capacitance of the 220, 222, 224, 226 is summed to create a larger capacitance at the power output terminal 212. Similarly, the respective input terminals 251, 253, 255, 257 of the capacitors 240, 242, 244, 246 on die 204 are connected in parallel to the power input terminal 214, and the respective output terminals 252, 254, 256, 258 of the capacitors 240, 242, 244, 246 are connected in parallel to the power output terminal 216. In this example, the capacitance of the 240, 242, 244, 246 is summed to create a larger capacitance at the power output terminal 216. In one example, dies 202, 204 are connected in parallel to a power source and output terminal to create summed capacitances of both dies.

In some implementations, the routing among capacitors can cross two or more levels of the die stack. In one such example, power input to the input terminal 210 in the capacitor die 202 is supplied from an external source (e.g., an interposer or substrate). However, the power input to the input terminal 214 in capacitor die 204 is provided from the output terminal 212 of capacitor die 202. For example, power can cross from one die to another in the die stack by way of a through-silicon via (TSV) or a through-mold via (TMV) (e.g., a conductive pillar), as will be explained in more detail below. In one example, the output terminal 212 and the input terminal 214 are electrically coupled through a TSV. In another example, the output terminal 212 and the input terminal 214 are electrically coupled through a conductive pillar. Although one power input and one power output are illustrated for each die 202, 204 more than one power input and power output can be provided to provide flexibility in the order and arrangement of the cross-die, inter-capacitor connections. In one example, each capacitor of each capacitor die 202, 204 is coupled to a power input terminal and a power output terminal of the die, such that all capacitors on a die are connected in parallel. In a particular example, a capacitor on one die 202 is connected in parallel with a capacitor on another die 204. Furthermore, routing from one die in the stack to another die, or to an external interconnect, can pass through an intervening die without connection to any device in that die. Moreover, the output from one die can be provided in parallel to two or more other dies. Thus, it can be seen that the cross-die capacitor circuits in a capacitor die stack can increase the capacitance density of a package without increasing the footprint as compared to a single integrated silicon capacitor die.

Figure 3:
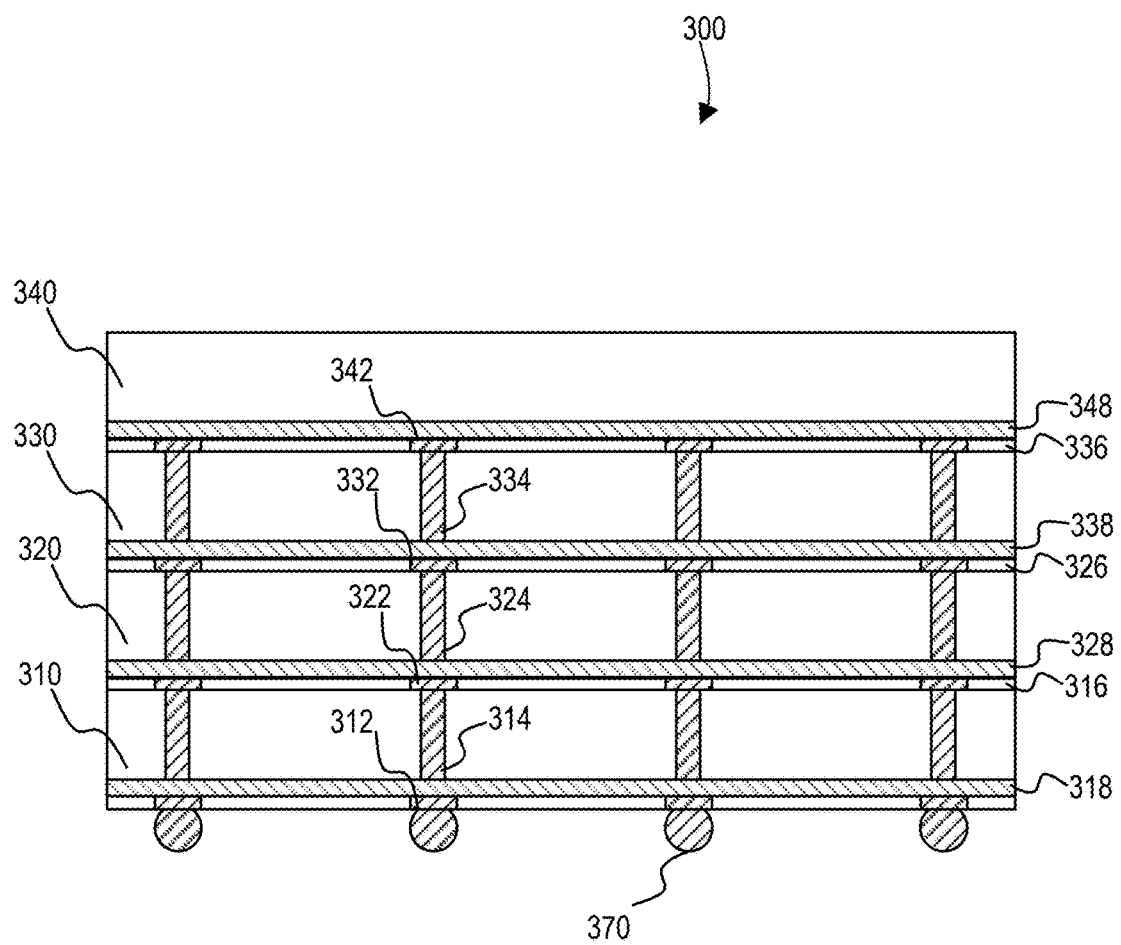
FIG. 3 sets forth a cross section block diagram of an example power delivery device die stack according to some implementations of the present disclosure.

For further explanation, FIG. 3 depicts a cross section view of an example integrated passive device die stack 300 in accordance with some implementations, which is one example of the power delivery device die stack 104 depicted in FIG. 1. In some examples, the passive device die stack 300 includes multiple silicon capacitor dies 310, 320, 330, 340. Although the following examples are described in the context of integrated capacitor dies, it will be appreciated that various implementations of the stack 300 be implemented with PIVR dies, voltage regulator dies, capacitor dies, inductor dies, or resistor dies, or combinations thereof. Although four capacitor dies are depicted in the FIG. 3, it will be appreciated that the passive device die stack 300 can include more or fewer dies. In the example of FIG. 3, adjacent dies in the die stack are electrically and mechanically coupled by a hybrid metal and insulating bond, as will be described in more detail below.

In some examples, the capacitor die 310 includes an interconnection layer 318 that provides a power input to one or more capacitor terminals (not depicted) of the capacitor die 310, routes power among the capacitor terminals, and supplies power output from the capacitor die, as discussed above with reference to FIG. 2. For example, the interconnection layer 318 can be back end of line (BEOL) layers of metal routing, which may be interspersed on or within a dielectric material. The interconnection layer 318 can be fabricated during a wafer fabrication process using well-known techniques.

In some implementations, the bottom capacitor die 310 in the capacitor die stack 300 includes conductor pads 312 that provide power input to and power output from the capacitor die 310. For example, the capacitor die 310 can receive power input through a conductor pad 312 coupled to a solder structure 370, which is couplable to an interposer, substrate, PCB, or other component. The capacitor die 310 can supply power output through a conductor pad 312 coupled to a solder structure 370, which is couplable to an interposer, substrate, PCB, or other component. The conductor pads 312 are also coupled to the terminal routing in the interconnection layer 318.

In some implementations, the capacitor die 310 also includes through-silicon vias 314 (TSVs) coupled to some or all of the conductor pads 312. The TSVs 314 can be composed of various conductor materials, such as copper, silver, gold, platinum, palladium or others. In some examples, each TSV 314 is surrounded laterally by a liner layer (not shown) of an insulator (e.g., $SiO_2$) and a barrier layer of TiN or other barrier materials. The TSVs 314 are further coupled to respective interconnects 322 that couple the bottom capacitor die 310 to a stacked capacitor die 320. As will be explained in more detail below, the interconnects 322 are formed by a metallurgical bond between respective conductor pads (not shown) of the capacitor dies 310, 320. The capacitor dies 310, 320 are also mechanically coupled by an insulating layer bond 316 formed from a bond between respective insulating layers (not shown) of the capacitor dies 310, 320.

In some examples, like the bottom capacitor die 310, the stacked capacitor die 320 includes an interconnection layer 328 that provides a power input to one or more capacitor terminals (not depicted) of the capacitor die 320, routes power among the capacitor terminals, and supplies power output from the capacitor die. For example, the interconnection layer 328 can be BEOL layers of metal routing, which may be interspersed on or within a dielectric material. The interconnection layer 328 can be fabricated during a wafer fabrication process using well-known techniques. In some examples, like the bottom capacitor die 310, the stacked capacitor die 320 includes TSVs 324 that are coupled to interconnects 322. In some examples, one or more of the TSVs 324 are also coupled to interconnects 332 that couple the capacitor die 320 to another stacked capacitor die 330. In some implementations, the interconnects 332 are formed by a metallurgical bond between respective conductor pads (not shown) of the capacitor dies 320, 330. The capacitor dies 320, 330 are also mechanically coupled by an insulating layer bond 326 formed from a bond between respective insulating layers (not shown) of the capacitor dies 320, 330. In some implementations, power input to the stacked capacitor die 320 is provided through one or more interconnects 322, 332 coupled to one or more TSVs 314, 324; similarly, power output from the capacitor die is provided through one or more interconnects 322, 332 coupled to one or more TSVs 314, 324.

In some examples, like the capacitor die 320, the stacked capacitor die 330 includes an interconnection layer 338 that provides a power input to one or more capacitor terminals (not depicted) of the capacitor die 330, routes power among the capacitor terminals, and supplies power output from the capacitor die. For example, the interconnection layer 338 can be BEOL layers of metal routing, which may be interspersed on or within a dielectric material. The interconnection layer 338 can be fabricated during a wafer fabrication process using well-known techniques. In some examples, like the capacitor die 320, the stacked capacitor die 330 includes TSVs 334 that are coupled to interconnects 332. In some examples, one or more of the TSVs 334 are also coupled to interconnects 342 that couple the capacitor die 330 to another stacked capacitor die 340. In some implementations, the interconnects 342 are formed by a metallurgical bond between respective conductor pads (not shown) of the capacitor dies 330, 340. The capacitor dies 330, 340 are also mechanically coupled by an insulating layer bond 336 formed by a bond between respective insulating layers (not shown) of the capacitor dies 330, 340. In some implementations, power input to the stacked capacitor die 330 is provided through one or more interconnects 332, 342 coupled to one or more TSVs 324, 334; similarly, power output from the capacitor die is provided through one or more interconnects 332, 342 coupled to one or more TSVs 324, 334.

In some examples, like the capacitor die 330, the stacked capacitor die 340 includes an interconnection layer 348 that provides a power input to one or more capacitor terminals (not depicted) of the capacitor die 340, routes power among the capacitor terminals, and supplies power output from the capacitor die. For example, the interconnection layer 348 can be BEOL layers of metal routing, which may be interspersed on or within a dielectric material. The interconnection layer 348 can be fabricated during a wafer fabrication process using well-known techniques. In some implementations, power input to the stacked capacitor die 340 is provided through one or more interconnects 342 coupled to one or more TSVs 334; similarly, power output from the capacitor die is provided through one or more interconnects 342 coupled to one or more TSVs 334. In this example, the capacitor die 340 is the top capacitor die in the die stack. Thus, the capacitor die 340 need not include TSVs.

Thus, through the TSVs 314, 324, 334, the capacitors in various capacitor dies 310, 320, 330, 340 can be connect in series or parallel with other capacitors on different dies. For example, the output of a capacitor in capacitor die 340 can be supplied as the input of a capacitor in capacitor die 320 through TSVs 334, 324 and the respective interconnection layers 348, 328 that provide the routing between the TSVs and the capacitor terminals. In another example, the output of a capacitor in capacitor die 310 can be supplied in parallel to a capacitor in die 320, a capacitor in die 330, and a capacitor in die 340 through TSVs 314, 324, 334.

Figure 4:
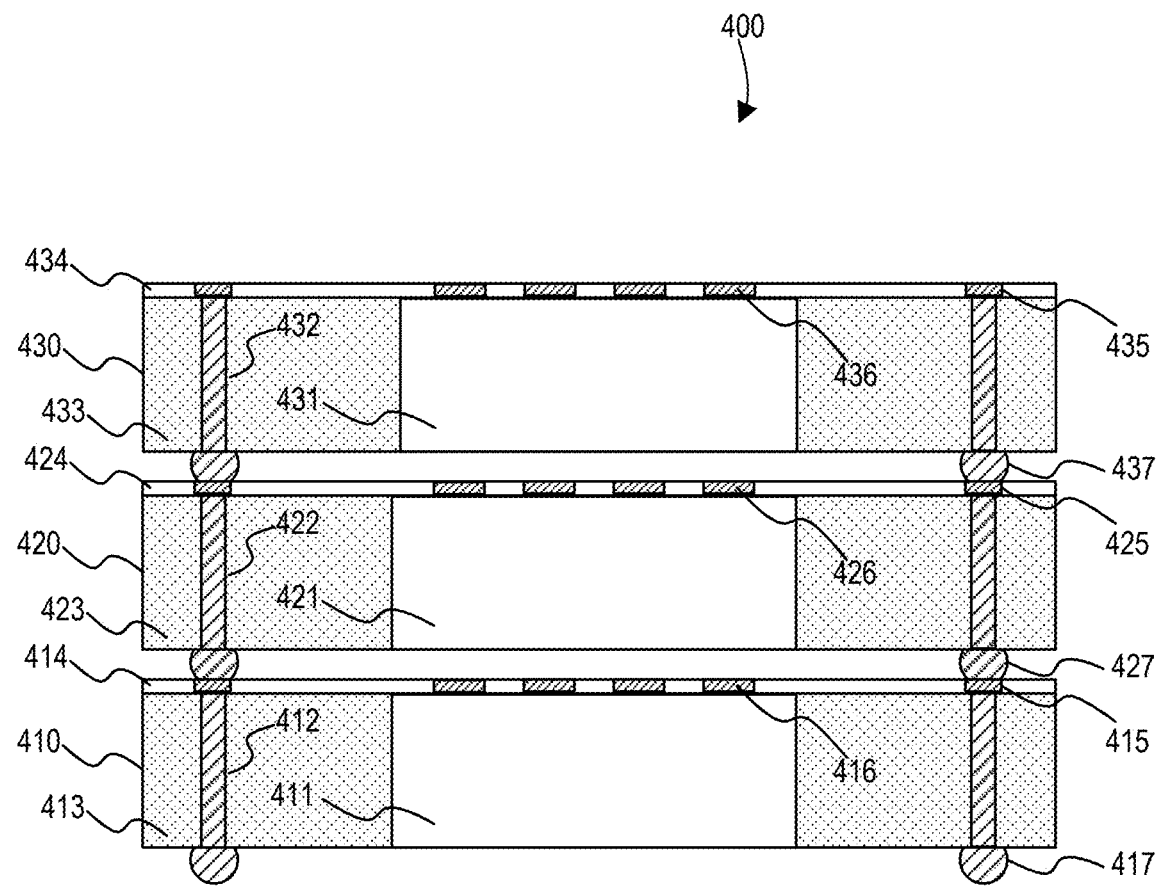
FIG. 4 sets forth a cross section block diagram of another example power delivery device die stack according to some implementations of the present disclosure.
Figure 5:
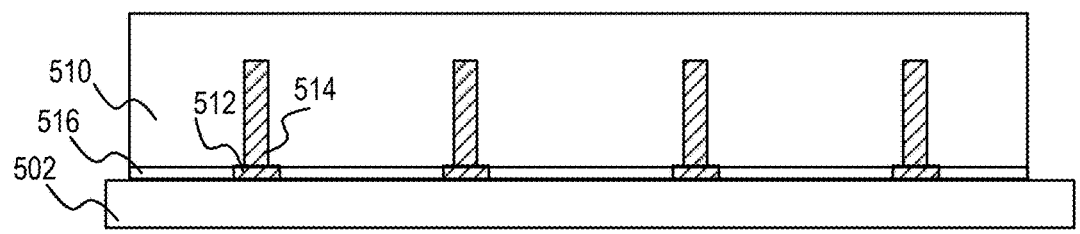
FIG. 5 is a portion of an example process flow for three-dimensional stacking of power delivery devices according to some implementations.

For further explanation, FIG. 4 depicts a cross section view of an example integrated passive device die stack 400 in accordance with some implementations, which is one example of the power delivery device die stack 104 depicted in FIG. 1. In some examples, the passive device die stack 400 includes multiple silicon capacitor die packages 410, 420, 430 each including a respective silicon capacitor die 411, 421, 431. Although the following examples are described in the context of integrated capacitor dies, it will be appreciated that various implementations of the die stack 400 could include PIVR dies, voltage regulator dies, capacitor dies, inductor dies, or resistor dies, or combinations thereof. Although four capacitor dies are depicted in the FIG. 4, it will be appreciated that the passive device die stack 400 can include more or fewer dies.

In some implementations, each capacitor die package 410, 420, 430 includes a respective mold layer 413, 423, 433 in which the respective silicon capacitor dies 411, 421, 431 are at least partially encased. The silicon capacitor dies can be similar to those discussed above in that each capacitor die 411, 421, 431 includes one or more capacitors and at least two terminals (power input and power output) for each capacitor. Each capacitor die package 410, 420, 430 also includes respective sets conductive pillars 412, 422, 432 that also at least partially encased in the mold layer 413, 423, 433. The conductive pillars 412, 422, 432 are composed of a conductive metal such as copper or another suitable metal. The encapsulant material of the mold layers 413, 423, 433 can be composed of a polymer material such as epoxy resin.

In some implementations, each capacitor die package 410, 420, 430 includes a redistribution layer (RDL) structure 414, 424, 434. In some examples, power is supplied to and from the capacitors of each capacitor die 411, 421, 431 through the conductive pillars 412, 422, 432 by way of the respective RDL structures 414, 424, 434. In some examples, each RDL structure 414, 424, 434 includes multiple layers that include conductive structures (e.g., traces, pads, vias) and an interlevel dielectric material. Traces provide lateral routing of electrical signals while conductive vias dispersed in the dielectric material provide vertical routing of electrical signals from underlying connectors (e.g., capacitor terminals) and overlying connectors (e.g., conductor pads 416, 426, 436) as well as between layers of traces and pads. In the example of FIG. 4, the RDL structure 414 of capacitor die package 410 connects (e.g., through conductive traces) conductor pads 416 coupled to the terminals of the capacitor die 411 to conductor pads 415 coupled to the conductive pillars 412. Similarly, the RDL structure 424 of capacitor die package 420 connects conductor pads 426 coupled to the terminals of the capacitor die 421 to conductor pads 425 coupled to the conductive pillars 422. Similarly, the RDL structure 434 of capacitor die package 430 connects conductor pads 436 coupled to the terminals of the capacitor 431 die to conductor pads 435 coupled to the conductive pillars 432. The conductive structures can be composed of various conductor materials, such as copper, aluminum, silver, gold, platinum, palladium, laminates of these or others.

In some implementations, each capacitor die package 410, 420, 430 includes respective solder structures 417, 427, 437. In the example of FIG. 4, the solder structures 437 of capacitor die package 430 are coupled to the conductive pillars 432 and are metallurgically bonded to conductor pads 425 in the RDL structure 424 of capacitor die package 420. The solder structures 427 of capacitor die package 420 are coupled to the conductive pillars 422 and are metallurgically bonded to conductor pads 415 in the RDL structure 414 of capacitor die package 420. The solder structures 417 of capacitor die package 410 are coupled to the conductive pillars 412 and can be used to mount the die stack 400 on another component such as an interposer, substrate, or PCB.

Thus, through the conductive pillars 412, 422, 432 and RDL structures 414, 424, 434, the capacitors on various capacitor dies 411, 421, 431 can be connect in series or parallel with other capacitors on different dies. For example, the output of a capacitor in capacitor die 330 can be supplied as the input of a capacitor in capacitor die 320 through conductive pillars 432 and the respective RDL layers 434, 424 that provide the routing between the conductive pillars 432 and the capacitor terminals. In another example, the output of a capacitor in capacitor die 310 can be supplied in parallel to a capacitor in die 320 and a capacitor in capacitor die 330 through conductive pillars 422, 432 and respective RDL structures 414, 424, 434.

For further explanation, FIGS. 5-13 set forth another example process flow for constructing a semiconductor device including stacked power delivery devices, such as the example implementation of a semiconductor device 300 as depicted in FIG. 3, according to various implementations of the present disclosure. Beginning with FIG. 5, a capacitor wafer 510 is placed on a carrier 502 that will support the processing of the capacitor wafer. For example, the carrier can be a glass carrier. The capacitor wafer 510 includes multiple capacitor dies and an insulating layer 516 applied to a bottom surface of the capacitor wafer. The insulating layer 516 can be composed of, for example, silicon oxides (e.g., SiO2) or other glasses. Disposed within the insulating layer 516 are multiple conductor pads 512. In some cases, the conductor pads 512 can be used as bond pads for bumpless coupling to another wafer. However, where the wafer is the bottom wafer of the stack, as is the case with the capacitor wafer 510, the conductor pads 512 can be coupled to external solder structures such as C4 bumps or microbumps. The conductor pads 512 can be composed of various conductor materials, such as copper, silver, gold, platinum, palladium or others. The conductor pads 512 are coupled to TSVs 514. In some examples, the TSVs 514 are buried TSVs that were fabricated during a wafer fabrication process. The TSVs 514 can be composed of various conductor materials, such as copper, silver, gold, platinum, palladium or others.

Figure 6:
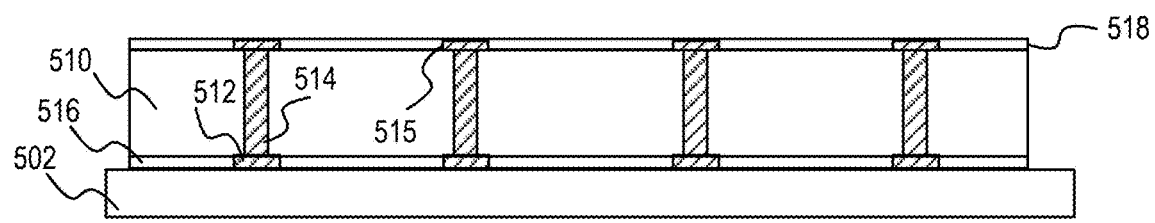
FIG. 6 is another portion of the example process flow for three-dimensional stacking of power delivery devices according to some implementations.

Moving to FIG. 6, bulk silicon material is removed from the back surface (i.e., the top surface in FIG. 5) of the capacitor wafer 510 to expose the buried TSVs 514. Another insulating layer 518 is deposited on the back surface of the capacitor wafer. In some examples, the insulating layer 518 is composed of silicon oxynitride. In some implementations, the insulating layer 518 is deposited on the back surface of the capacitor wafer 510 through a plasma enhanced chemical vapor deposition (PECVD) technique or other well-known technique. In some examples, openings in the insulating layer 518 are fabricated using well-known masking and etching techniques and conductor pads 515 are formed in the openings using well-known masking, plating, CVD, or physical vapor deposition (PVD) techniques, or combinations of these techniques. In some examples, following the formation of the conductor pads 515, a chemical-mechanical polishing (CMP) process is performed to planarize the surface of the insulating layer 518.

Figure 7:
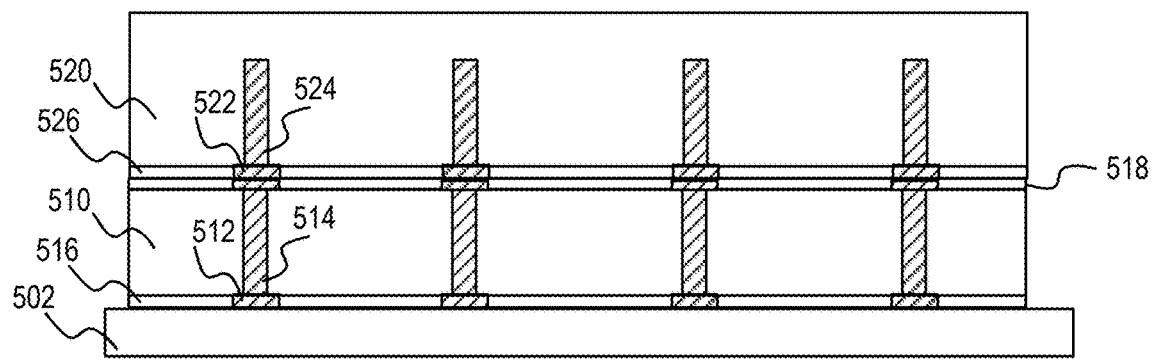
FIG. 7 is another portion of the example process flow for three-dimensional stacking of power delivery devices according to some implementations.

Moving to FIG. 7, a second capacitor wafer 520 is placed on top of the first capacitor wafer 510. Like the first capacitor wafer 510, the second capacitor wafer 520 includes multiple capacitors and an insulating layer 526 formed on the bottom surface of the capacitor wafer 520 with multiple conductor pads 522 disposed within the insulating layer 526. In some examples, insulating material (e.g., SiO₂) composing the insulating layer 526 is deposited on the front surface (i.e., bottom) of the capacitor wafer 520 through a PECVD technique or other well-known technique. In some examples, openings in the insulating layer 526 are fabricated using well-known masking and etching techniques and the conductor pads 522 are formed in the openings using well-known masking, plating, CVD, or physical vapor deposition (PVD) techniques, or combinations of these techniques. The second capacitor wafer 520 is placed such that the conductor pads 522 align with the conductor pads 515 of the first capacitor wafer 510. The second capacitor wafer 520 includes TSVs 524 coupled to the conductor pads 522. In some examples, the TSVs 514 are buried TSVs that were fabricated during a wafer fabrication process. The TSVs 514 and conductor pads 512 can be composed of various conductor materials, such as copper, silver, gold, platinum, palladium or others.

Figure 8:
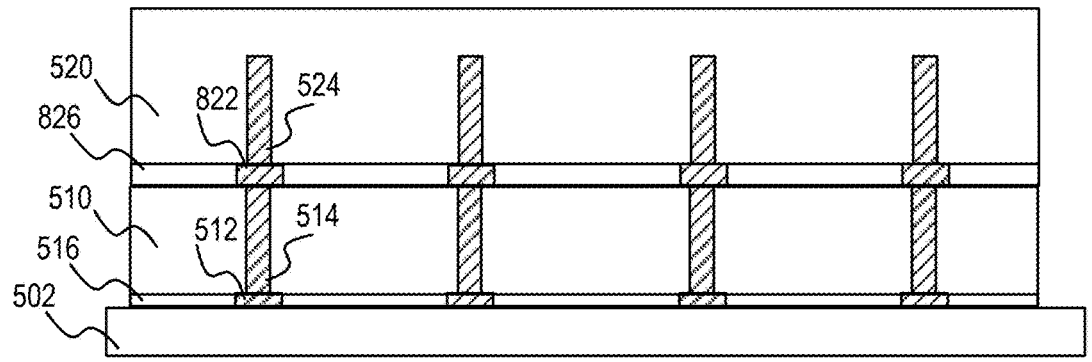
FIG. 8 is another portion of the example process flow for three-dimensional stacking of power delivery devices according to some implementations.

Moving to FIG. 8, the capacitor wafers 510, 520 are bonded together in a hybrid bonding process in which the conductor pads 515, 522 of FIG. 7 are metallurgically bonded to create interconnects 822 while the insulating layers 518, 526 are bonded to create an insulating bond layer 826. The hybrid bond can be created through a multi-stage anneal process. In one example, the first anneal is carried out at a temperature (e.g., 150° C.) that will allow a bond to form between the insulating layers 518, 526. Next, a second anneal process is performed to produce a thermal expansion of the conductor pads 515, 522 resulting in a metallurgical bond that forms the interconnects 822. As the temperature is increased during the second anneal process, the conductor pads 515, 522 undergo thermal expansion in an unconstrained fashion along a y-axis (perpendicular to the bonding plane) but with constraint along the x-axis due to the bonds between the insulating layers 518, 526.

Figure 9:
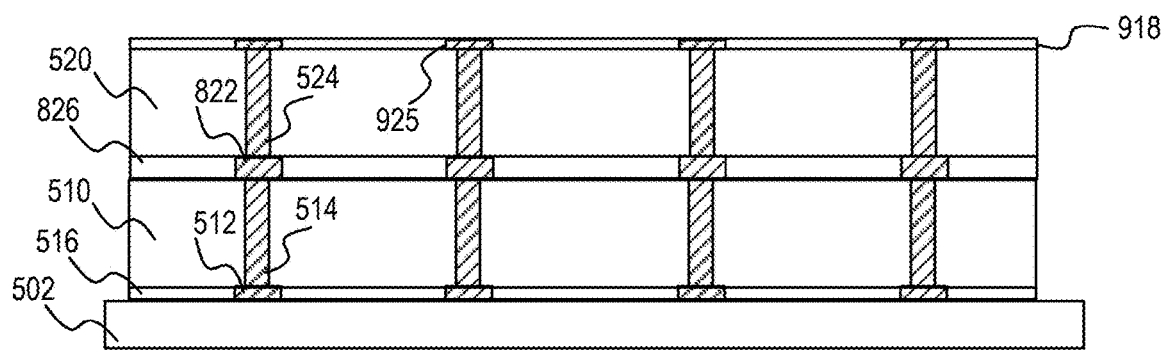
FIG. 9 is another portion of the example process flow for three-dimensional stacking of power delivery devices according to some implementations.

Moving to FIG. 9, bulk silicon material is removed from the back surface (i.e., the top surface in FIG. 8) of the capacitor wafer 520 to expose the buried TSVs 524. Another insulating layer 918 is deposited on the back surface of the capacitor wafer 520. In some examples, the insulating layer 918 is composed of silicon oxynitride. In some implementations, the insulating layer 918 is deposited on the back surface of the capacitor wafer 520 through a PECVD technique or other well-known technique. In some examples, openings in the insulating layer 918 are fabricated using well-known masking and etching techniques and conductor pads 925 are formed in the openings using well-known masking, plating, CVD, or physical vapor deposition (PVD) techniques, or combinations of these techniques. In some implementations, following the formation of the conductor pads 925, a chemical-mechanical polishing (CMP) process is performed to planarize the surface of the insulating layer 918.

Figure 10:
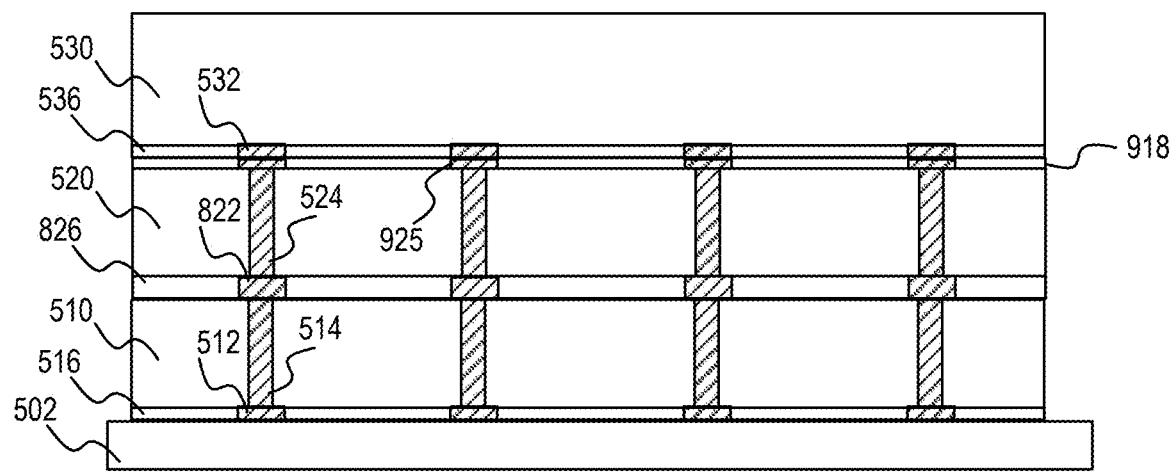
FIG. 10 is another portion of the example process flow for three-dimensional stacking of power delivery devices according to some implementations.

Moving to FIG. 10, a third capacitor wafer 530 (which, in this example, is the final capacitor wafer) is placed on top of the second capacitor wafer 520. Like the first capacitor wafer 510 and the second capacitor wafer 520, the third capacitor wafer 530 includes multiple capacitors and an insulating layer 536 formed on the bottom surface of the capacitor wafer 530 with multiple conductor pads 532 disposed within the insulating layer 536. In some examples, insulating material (e.g., SiO₂) composing the insulating layer 536 is deposited on the face (i.e., bottom surface) of the capacitor wafer 530 through a PECVD technique or other well-known technique. In some examples, openings in the insulating layer 536 are fabricated using well-known masking and etching techniques and the conductor pads 532 are formed in the openings using well-known masking, plating, CVD, or physical vapor deposition (PVD) techniques, or combinations of these techniques. In some implementations, as depicted in FIG. 10, the final capacitor wafer 530 does not require TSVs. The third capacitor wafer 530 is placed such that the conductor pads 532 align with the conductor pads 925 of the second capacitor wafer 520.

Figure 11:
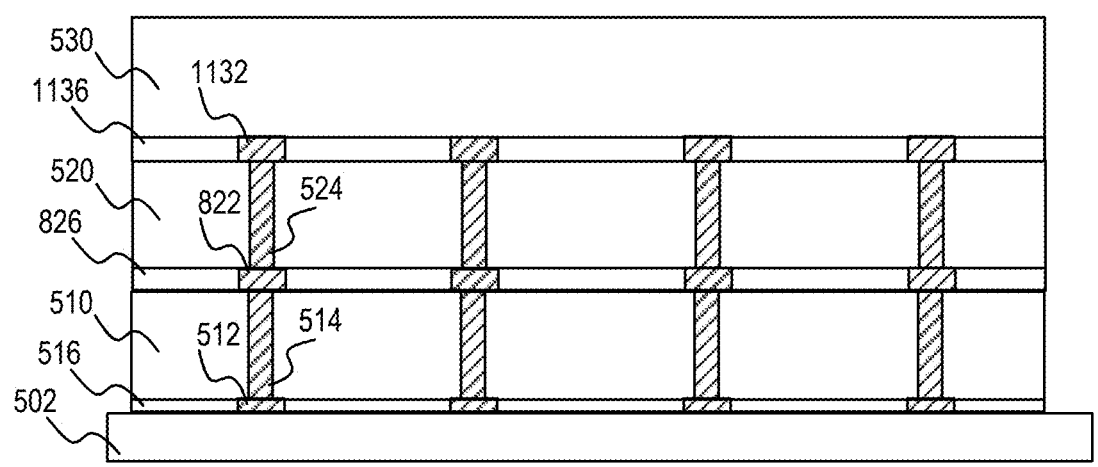
FIG. 11 is another portion of the example process flow for three-dimensional stacking of power delivery devices according to some implementations.

Moving to FIG. 11, the second and third capacitor wafers 520, 530 are bonded together in a hybrid bonding process in which the conductor pads 925, 532 of FIG. 10 are metallurgically bonded to create interconnects 1132 and the insulating layers 918, 536 are bonded to create an insulating bond layer 1136. The hybrid bonding process can be carried out as discussed above.

Figure 12:
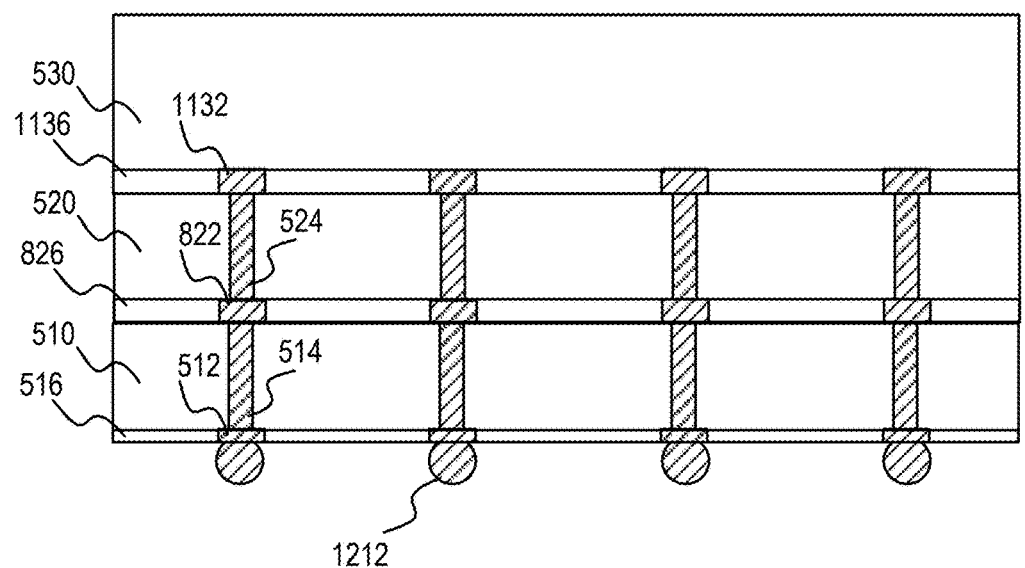
FIG. 12 is another portion of the example process flow for three-dimensional stacking of power delivery devices according to some implementations.

Moving to FIG. 12, the carrier 502 is removed and solder structures 1212 are attached to the first capacitor wafer 510 in electrical contact with the conductor pads 512.

Figure 13:
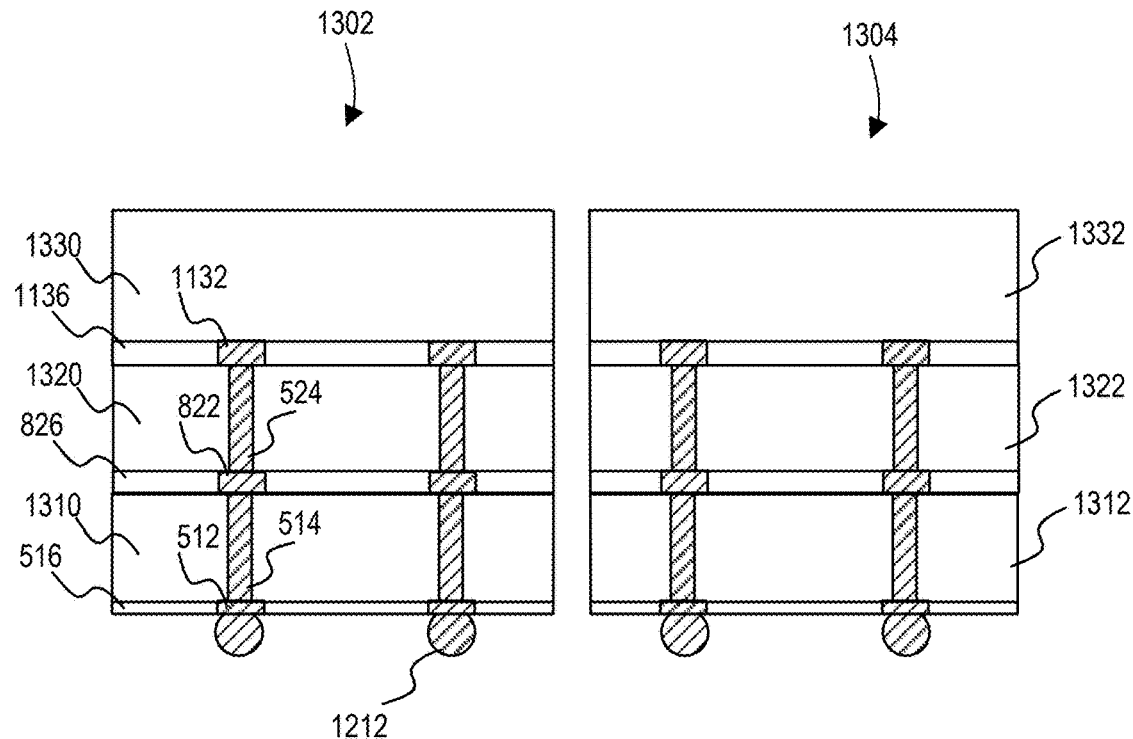
FIG. 13 is another portion of the example process flow for three-dimensional stacking of power delivery devices according to some implementations.
Figure 14:
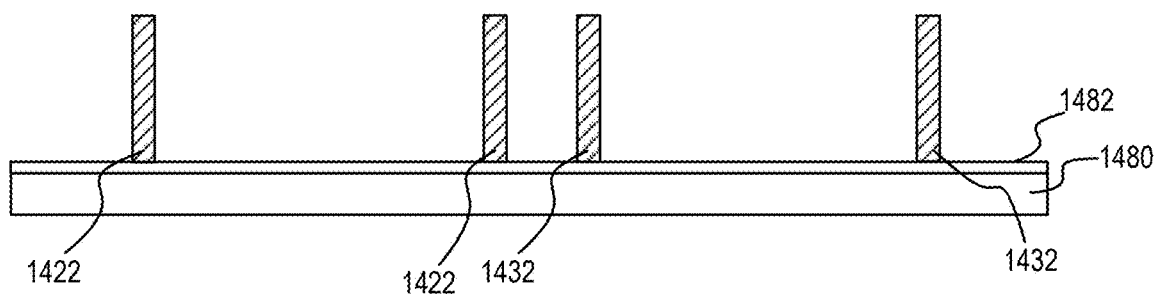
FIG. 14 is portion of another example process flow for three-dimensional stacking of power delivery devices according to some implementations.

Moving to FIG. 13, the stack of capacitor wafers 510, 520, 530 is singulated to yield two capacitor die stacks 1302, 1304. Die stack 1302 includes capacitor dies 1310, 1320, 1330. Die stack 1304 includes capacitor dies 1312, 1322, 1332. For example, the stack of capacitor wafers 510, 520, 530 can be singulated using a wafer saw.

Although FIGS. 5-13 depict a face-to-back hybrid bonding process, it is further contemplated that the bottom capacitor wafer is placed face up, such that the face (i.e., terminal side) of the capacitor wafer 510 is opposite the face of the capacitor wafer 520. In such a configuration, the conductor pads 512 of the bottom capacitor wafer 510 are bonded directly to the conductor pads 522 of the second capacitor wafer 520 in a face-to-face hybrid bonding process. In such an example, the carrier 502 can be omitted from the process flow. In another alternative implementation, although a wafer bonding process is depicted in FIGS. 5-13, the same process can be applied to the bonding of individual dies.

For further explanation, FIGS. 14-21 set forth another example process flow for constructing a semiconductor device include stacked power delivery device dies, such as the example implementation of a semiconductor device 400 as depicted in FIG. 4, according to various implementations. Beginning with FIG. 14, a dielectric layer 1482 is deposited on a carrier 1480 that will support the placement of capacitor dies and the formation of conductive pillars. In some examples, the dielectric layer 1482 is a layer of polyimide or other polymer material. The dielectric layer 1482 can be applied using spin coating or the like. In some examples, prior to depositing the dielectric layer 1482, a release film (not depicted) is applied to the carrier 1480. The release film can be a light activated, thermally activated, or other type of adhesive or even some form of tape that can enable the carrier 1480 to be removed without destructively damaging the structures mounted thereon at the time of separation. The carrier 1480 can be composed of various types of glasses or even semiconductors, such as silicon.

Conductive pillars 1422, 1432 are then created on the dielectric layer 1482 that has been deposited on the carrier 1480. Creating conductive pillars on the dielectric layer 1482 can be carried out by various well-known techniques. In one example, a plating seed layer (not shown) is applied to the dielectric layer 1482. The plating seed layer can be composed of a variety of materials that are suitable for plating seed layers, such as copper or the like, and applied by well-known sputtering, chemical vapor deposition, electroless plating or the like. In these examples, a photolithography mask is applied to the plating seed layer and patterned photolithographically to produce plural openings that will be used to plate the conductive pillars 1422, 1432. With the photolithography mask in place and patterned, a plating process is performed to fabricate the conductive pillars 1422, 1432. The photolithography mask is stripped using ashing, solvent stripping or the like to yield the conductive pillars 1422, 1432 positioned on the dielectric layer 1482. Portions of the plating seed layer (not shown) on the dielectric layer 1482 lateral to the pillars 1422, 1432 are etched using well-known etch techniques.

Figure 15:
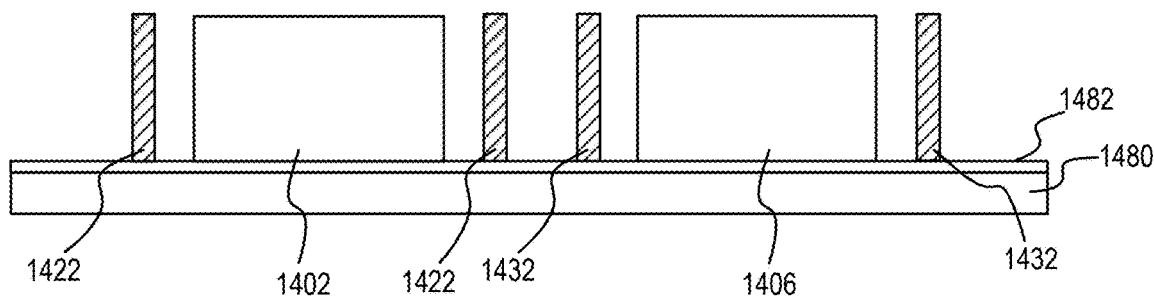
FIG. 15 is another portion of the example process flow for three-dimensional stacking of power delivery devices according to some implementations.

Moving to FIG. 15, capacitor dies 1402, 1406 are then placed on the dielectric layer 1482 using, for example, a pick and place process and die attach film. In some examples, the capacitor dies 1402, 1406 are placed face up, such that the terminal side of the capacitor dies 1402, 1406 is opposite a surface of the capacitors 1402, 1406 attached to the carrier 1480. The capacitor dies 1402, 1406 are created prior to the process flow depicted in FIGS. 14-21. In some examples, the capacitor dies 1402, 1406 are fabricated in a wafer process, diced, and tested to select known good dies. In the example of FIG. 15 capacitor die 1402 is placed among conductive pillars 1422 while the capacitor die 1406 is placed among conductive pillar 1432. It will be appreciated that any number of conductive pillars 1422, 1432 may be formed. It will also be appreciated that more or fewer capacitor dies than depicted in FIG. 15 may be placed.

Figure 16:
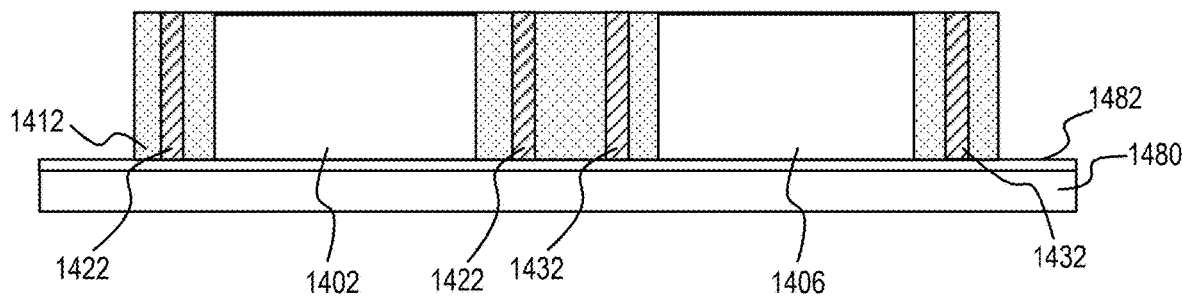
FIG. 16 is another portion of the example process flow for three-dimensional stacking of power delivery devices according to some implementations.

Moving to FIG. 16, a mold layer 1412 is fabricated by encasing the capacitor dies 1402, 1406 and conductive pillars 1422, 1432 in encapsulant material. In some implementations, encasing the capacitor dies 1402, 1406 and conductive pillars 1422, 1432 is carried out by depositing the encapsulant material on and around the capacitor dies 1402, 1406, conductive pillars 1422, 1432, and exposed portions of the dielectric layer 1482. The encapsulant material can be deposited using compressive molding, transfer molding, liquid encapsulant molding, spin coating, or another suitable application. The encapsulant material can be a polymer material such as epoxy resin. Excess encapsulant material is removed by grinding or etching to expose surfaces of the conductive pillars 1422, 1432 and surfaces the capacitor dies 1402, 1406.

Figure 17:
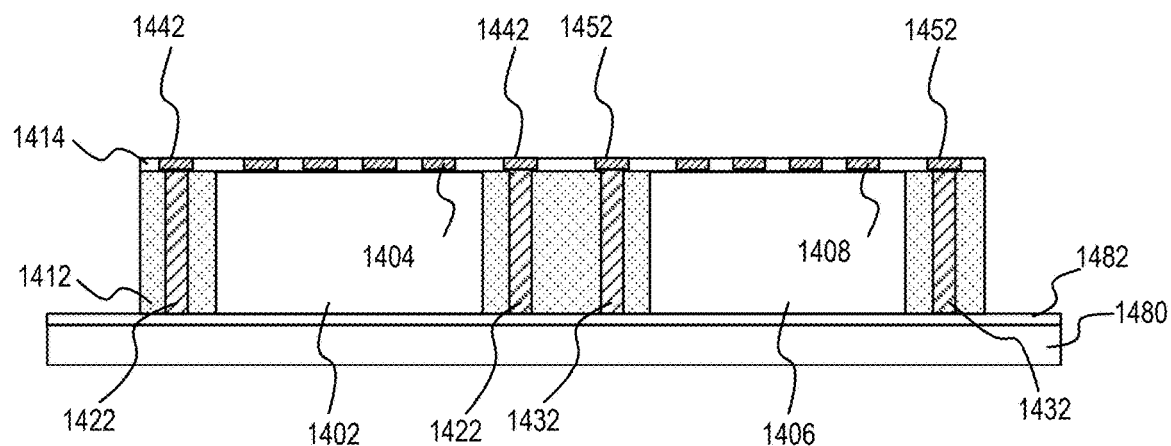
FIG. 17 is another portion of the example process flow for three-dimensional stacking of power delivery devices according to some implementations.

Moving to FIG. 17, an RDL structure 1414 is fabricated on the mold layer 1412, exposed surfaces of the conductive pillars 1422, and exposed surfaces of the capacitor dies 1402, 1406. In the example depicted in FIG. 17, the RDL structure 1414 includes conductive pads 1442 coupled to conductive pillars 1422 and conductive pads 1404 coupled to the capacitor die 1402. In this example, the RDL structure 1414 also includes a network of conductive traces (not shown) providing interconnections between the conductive pads 1442 coupled to the pillars 1422 and the conductive pads 1404 coupled to the capacitor die 1402, so as to provide routing for power input and power output to and from the pillars 1422. In the example depicted in FIG. 17, the RDL structure 1414 also includes conductive pads 1452 coupled to conductive pillars 1432 and conductive pads 1408 coupled to the capacitor die 1402. In this example, the RDL structure 1414 also includes a network of conductive traces (not shown) providing interconnections between the conductive pads 1452 coupled to the pillars 1432 and the conductive pads 1408 coupled to the capacitor die 1406 so as to provide routing for power input and power output to and from the pillars 1432.

In various implementations, the RDL structure 1414 can be fabricated to include multiple layers of conductive elements, such as traces, pads, and via, and multiple layers of dielectric material. In various examples, the conductive elements can be constructed of copper, aluminum, gold, platinum, palladium, combinations of such or other conductors, and can be fabricated using well-known material deposition techniques, such as, plating, sputtering, chemical vapor deposition, combinations of these or the like and patterned as necessary using well-known photolithography and directional etching techniques. The interlevel layer(s) of dielectric material can be constructed of glass(es) such as silicon oxides or other types of interlevel dielectric layer materials. In one example, the dielectric material is a polyimide material or other suitable polymer material.

Figure 18:
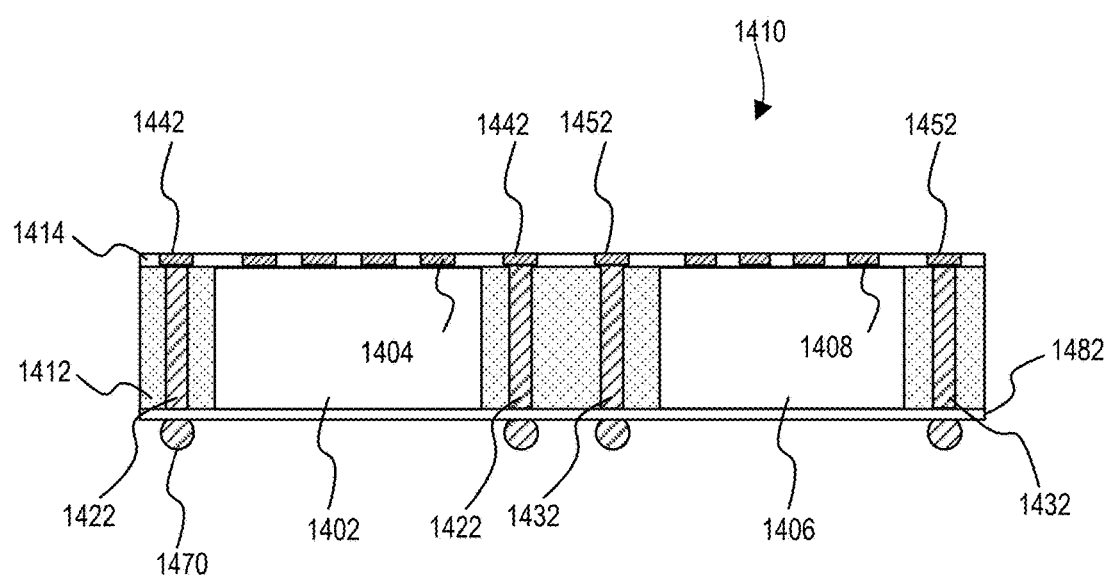
FIG. 18 is another portion of the example process flow for three-dimensional stacking of power delivery devices according to some implementations.

Moving to FIG. 18, the carrier 1480 is removed and solder structures 1470 (e.g., C4 bumps) are attached, thus finalizing the fabrication of a reconstituted capacitor wafer 1410. In some examples, the carrier 1480 is removed by deactivating a release film between the dielectric layer 1482 and the carrier 1480. The dielectric layer 1482 can be processed to establish openings leading to the conductive pillars 1422, 1432 in anticipation of the attachment of solder structures 1470. With the openings established in the dielectric layer 1482, the solder structures 1470 are attached to the conductive pillars 1422, 1432 by way of pick and place, stencil, or other solder attachment techniques.

Figure 19:
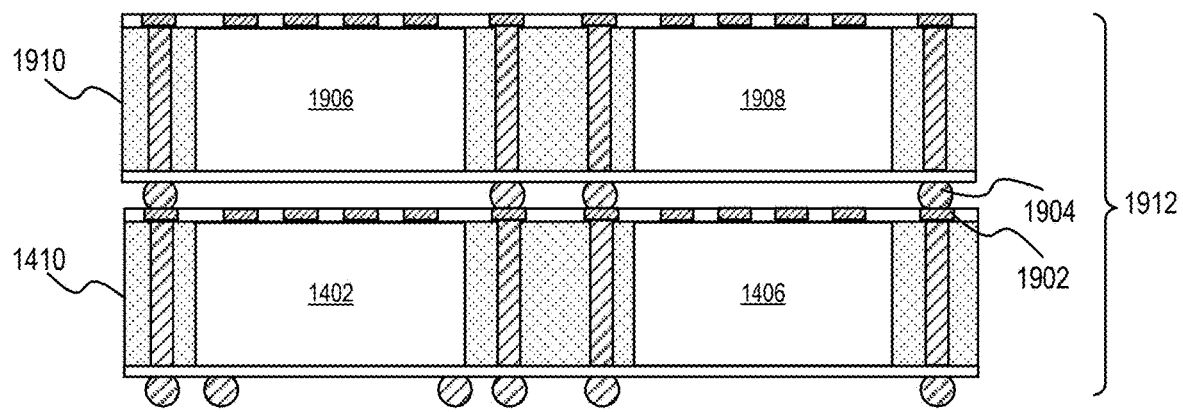
FIG. 19 is another portion of the example process flow for three-dimensional stacking of power delivery devices according to some implementations.

Moving to FIG. 19, a second reconstituted capacitor wafer 1910 that includes capacitor dies 1906, 1908 is stacked on the first reconstituted capacitor wafer 1410. The second reconstituted capacitor wafer 1910 is fabricated as described above with reference to FIGS. 14-18 and generally includes the same elements as the reconstituted capacitor wafer 1410. In some implementations, solder structures 1904 of the second reconstituted capacitor wafer 1910 are metallurgically bonded to bond pads 1902 (e.g., conductive pads 1442, 1452 described above) of the first reconstituted capacitor wafer 1410. For example, a solder reflow process can be used to establish the bonds. Subsequently, additional reconstituted capacitor wafers can be successively stacked using the process described here. Further, although only two capacitor dies are shown in each reconstituted capacitor wafer, it should be appreciated that any number of capacitor dies can be included.

Figure 20:
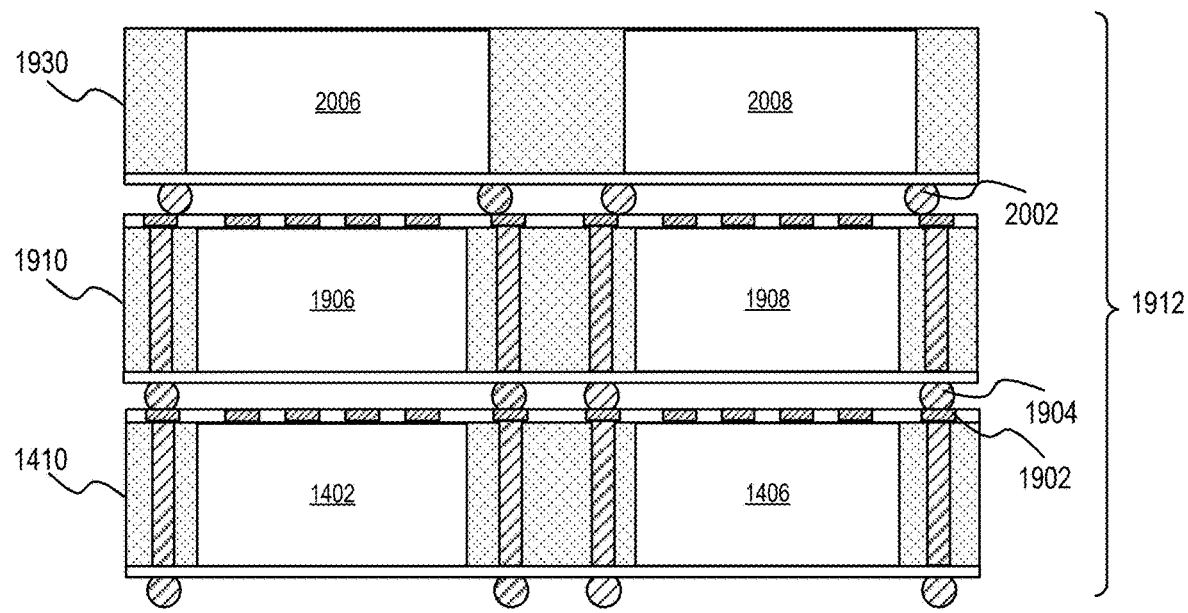
FIG. 20 is another portion of the example process flow for three-dimensional stacking of power delivery devices according to some implementations.

Moving to FIG. 20, a final reconstituted capacitor wafer 1930 including capacitor dies 2006, 2008 is added to the stack 1912. In some examples, the final reconstituted capacitor wafer 1930 does not include conductive pillars and an RDL structure. Instead, the capacitors 2006, 2008 are placed face down such that the terminals of the capacitor dies 2006, 2008 face the RDL structure of the reconstituted capacitor wafer 1910 below. The solder structures 2002 of the final reconstituted capacitor wafer 1930 are electrically coupled to these terminals. It is noted that more or fewer reconstituted capacitor wafers than depicted in FIG. 20 can compose the stack 1912.

Figure 21:
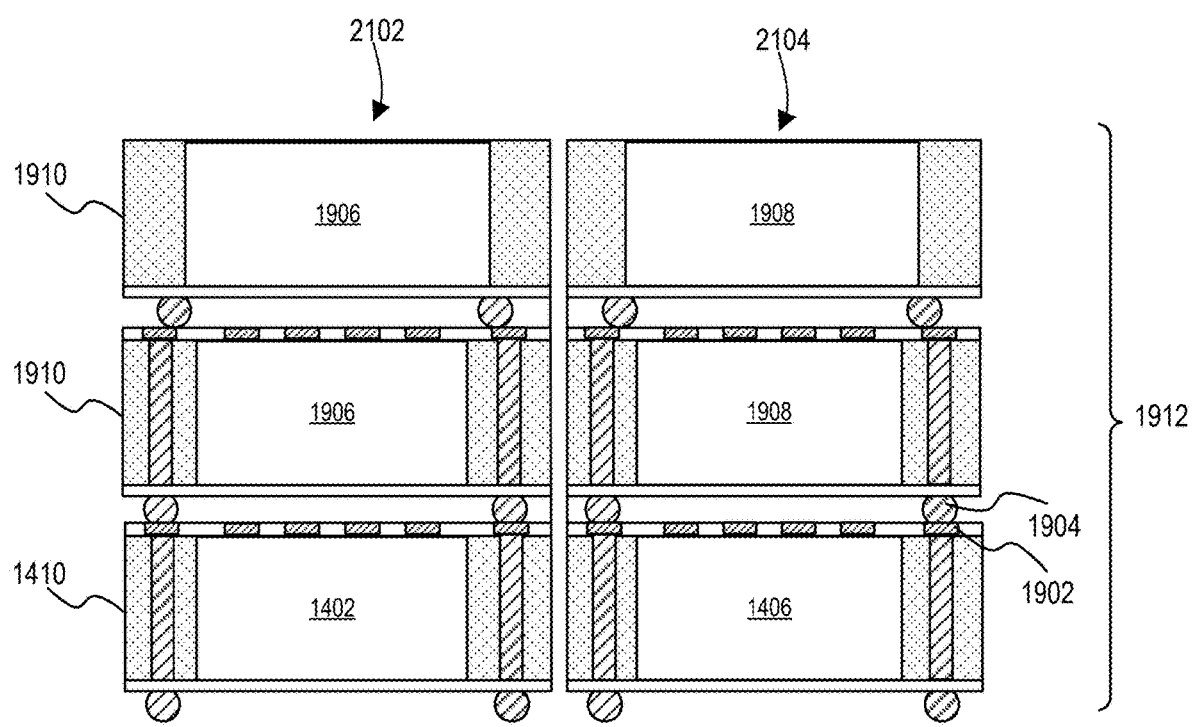
FIG. 21 is another portion of the example process flow for three-dimensional stacking of power delivery devices according to some implementations.

Moving to FIG. 21, the stack 1912 of reconstituted capacitor wafers 1410, 1910, 1930 is singulated to yield two capacitor die stacks 2102, 2104. The capacitor die stack 2102 includes capacitor dies 1402, 1906, 2006 and the capacitor die stack 2104 includes capacitor dies 1406, 1908, 2008. For example, the stack 1912 can be singulated using a wafer saw.

Figure 22:
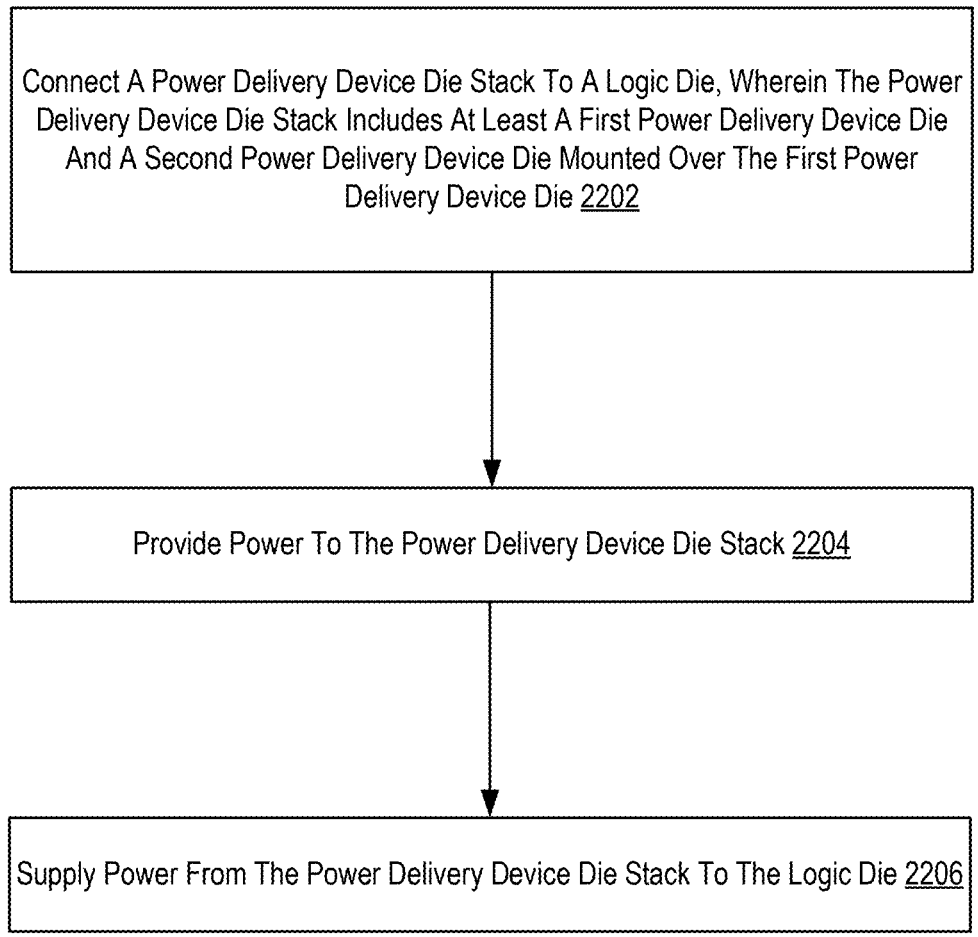
FIG. 22 is a flowchart of an example method of using a three-dimensional stacking of power delivery devices according to some implementations.

For further explanation, FIG. 22 sets forth a flow chart illustrating an example method of using a three-dimensional stacked power delivery device according to some implementations of the present disclosure. The example method of FIG. 22 includes connecting 2202 a power delivery device die stack to a logic die. In some implementations, the power delivery device die stack (e.g., the power delivery device die stack 104 of FIG. 1, the passive device die stack 300 of FIG. 3, or the passive device die stack 400 of FIG. 4) is connected to a logic die (e.g., the logic die 114 of FIG. 1) by coupling the power delivery device die stack and the logic die to an interposer, substrate, or PCB that provides routing for supplying power from the power delivery device die stack to the logic die. In other implementations, the power delivery device die stack is coupled to a surface of the logic die.

The method of FIG. 22 also includes providing 2204 power to the power delivery device die stack. In some implementations, power is supplied to the power delivery device die stack from an external power supply through a solder structure connecting the bottom-most power delivery device die in the power delivery device die stack to the interposer, substrate, or PCB.

The method of FIG. 22 also includes supplying 2206 power from the power delivery device die stack to the logic die. In some implementations, the power is supplied through a circuit in the power delivery device die stack, where the circuit includes one or more passive devices from a first die in the power delivery device die stack and one or more passive devices from a second die in the power delivery device die stack. In some implementations, the power is supplied to the logic die from the power delivery device die stack through the interposer, substrate, or PCB.

Figure 23:
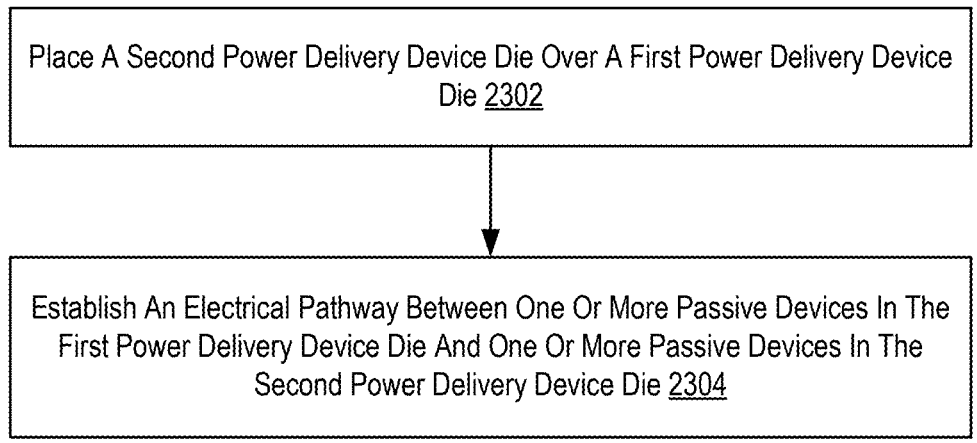
FIG. 23 is a flowchart of an example method of fabricating three-dimensional stacking of power delivery devices according to some implementations.

For further explanation, FIG. 23 sets forth a flow chart illustrating an example method of fabricating a three-dimensional stack of integrated power delivery devices according to some implementations of the present disclosure. The method of FIG. 23 includes placing 2302 a second power delivery device die over a first power delivery device die. For example, the second power delivery device die can be the passive device die 320 of FIG. 3 or the passive device die 421 of FIG. 4 and the first power delivery device die can be the passive device die 310 of FIG. 3 or the passive device die 411 of FIG. 4). In some examples, the first power delivery device die and the second power delivery device die can be passive device dies, PIVR dies that include integrated passive devices, voltage regulation dies, or combinations thereof. In some implementations, the power delivery device dies are placed in direct contact with one another (as depicted in FIG. 7). In these implementations, the power delivery device dies can be placed face-to-back or face-to-face. Where the power delivery device dies are mounted face-to-back, the first power delivery device die includes multiple TSVs. In other implementations, the power delivery device dies are included in respective device packages, where the passive device packages are mounted package-on-package through package interconnects. In some examples, placing 2302 a second power delivery device die over a first power delivery device die can be carried out by the process steps described above with reference to FIG. 7 or FIG. 10. In some examples, placing 2302 a second power delivery device die over a first power delivery device die can be carried out by the process steps described above with reference to FIG. 19 or FIG. 20.

The method of FIG. 23 also includes establishing 2304 an electrical pathway between one or more passive devices in the first power delivery device die and one or more passive devices in the second power delivery device die. In some implementations, the electrical pathway is established through a hybrid bonding process in which an insulating layer on the first power delivery device die is bonded to an insulating layer on the second power delivery device die while conductor pads on the first power delivery device die are metallurgically bonded to conductor pads on the second power delivery device die to form interconnects. The interconnects can be coupled to TSVs. In some implementations, the electrical pathway includes at least one interconnect coupling the power delivery device dies and at least one TSV in the first power delivery device die. In other implementations, the electrical pathway is established through a package-on-package bonding process in which package interconnects connected to the second power delivery device die are metallurgically bonded to conductor pads on the first power delivery device die. The conductor pads on the first power delivery device die can be connected, via an RDL structure, to terminals of one or more passive devices and to through-mold vias. The package interconnects of the second power delivery device die can be coupled to through-mold vias that provide routing to an RDL structure on the second power delivery device die, which is coupled to passive device terminals of passive devices in the second power delivery device die. In some examples, establishing 2304 the electrical pathway can be carried out by the process steps described above with reference to FIGS. 5-11. In some examples, establishing 2304 the electrical pathway can be carried out by the process steps described above with reference to FIG. 14-20.

Figure 24:
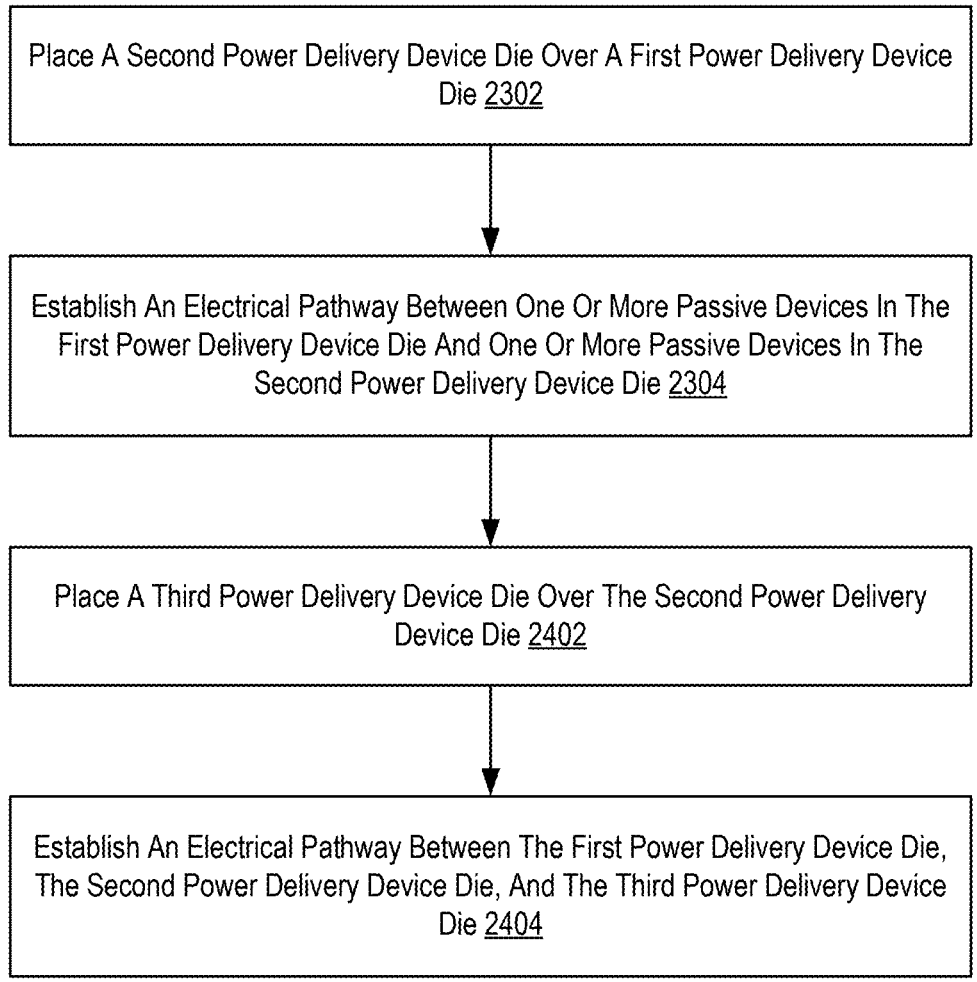
FIG. 24 is a flowchart of another example method of fabricating three-dimensional stacking of power delivery devices according to some implementations.

For further explanation, FIG. 24 sets forth a flow chart illustrating another example method of fabricating a power delivery device die stack according to some implementations of the present disclosure. The method of FIG. 24 is similar to the method of FIG. 23. However, the method of FIG. 24 also includes placing 2402 a third power delivery device die over the second power delivery device die. For example, the third power delivery device die can be the passive device die 330 in FIG. 3 or the passive device die 431 in FIG. 4. In some implementations, the third power delivery device die is placed on the second power delivery device die as described above with reference to placing 2402 the second power delivery device die over the first power delivery device die. In some examples, the third power delivery device die is placed over the second power delivery device die in accordance with the FIGS. 5-13 and the description thereof. In some examples, the third power delivery device die is placed over the second power delivery device die in accordance with the FIGS. 14-21 and the description thereof.

The method of FIG. 24 also includes establishing 2404 an electrical pathway between the first power delivery device die, the second power delivery device die, and the third power delivery device die. In some implementations, the electrical pathway between the first power delivery device die, the second power delivery device die, and the third power delivery device die is established as described above with reference to FIGS. 5-13. In other implementations, the electrical pathway between the first power delivery device die, the second power delivery device die, and the third power delivery device die is established as described above with reference to FIGS. 14-21.

In view of the foregoing, it will be appreciated that implementations in accordance with the present disclosure provide a number of advantages. An adaptable passive device density is provided based on number of power delivery dies in the die stack without an impact to the surface area of the package. Signal and power integrity are improved with reduced power consumption by bringing IPDs and/or PIVRs closer to the logic die. Circuits within the power delivery device die stack can span multiple levels of the die stack to incorporate passive devices located on different power delivery device dies. Advanced packaging techniques such as hybrid bonding can be employed to reduce the height of the die stack, thus allowing for a greater number of power delivery device dies and an increased passive device density.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor device comprising:
a power delivery device die stack including a plurality of vertically arranged power delivery device dies, the plurality of power delivery device dies including at least a first power delivery device die and a second power delivery device die electrically connected to the first power delivery device die wherein the power delivery device die stack is configured to provide, from one or more circuits of the power delivery device stack, power for another die;
at least one first external interconnect for providing a power input to the power delivery device die stack; and
at least one second external interconnect, coupled to the one or more circuits, for supplying a power output from the power delivery device die stack, for the another die.

2. The semiconductor device of claim 1, wherein the first power delivery device die is one of a package integrated voltage regulator die, a voltage regulator die, an integrated capacitor die, an integrated inductor die, and an integrated resistor die; and wherein the second power delivery device die is one of one of a package integrated voltage regulator die, a voltage regulator die, an integrated capacitor die, an integrated inductor die, and an integrated resistor die.

3. The semiconductor device of claim 1, wherein the first power delivery device die includes a first plurality of passive devices; wherein second power delivery device die includes a second plurality of passive devices; and wherein one or more of the first plurality of passive devices is electrically connected to one or more of the second plurality of passive devices.

4. The semiconductor device of claim 1, wherein the second power delivery device die is mounted on the first power delivery device die; and
wherein the first power delivery device die and the second power delivery device die are mechanically and electrically connected through a hybrid metal and insulating bond.

5. The semiconductor device of claim 4, wherein the first power delivery device die includes through-silicon vias.

6. The semiconductor device of claim 1, wherein the first power delivery device die is included in a first power delivery device package having a redistribution layer fabricated on a first surface, the redistribution layer including a plurality of conductor pads; and
wherein the second power delivery device die is included in a second power delivery device package mounted on the first power delivery device package, the second power delivery device package having a plurality of external conductive bumps metallurgically bonded to the plurality of conductor pads.

7. The semiconductor device of claim 1, wherein the power delivery device die stack includes voltage regulation logic.

8. A semiconductor device comprising:
a power delivery device die stack including a plurality of vertically arranged power delivery device dies, the plurality of power delivery device dies including at least a first power delivery device die and a second power delivery device die electrically connected to the first power delivery device die, wherein the power delivery device stack is included in a semiconductor package and is configured to provide, from one or more circuits of the power delivery device stack, power to a logic die;
at least one first external interconnect for providing a power input to the power delivery device die stack; and
at least one second external interconnect, coupled to the one or more circuits, for supplying a power output from the power delivery device die stack.

9. The semiconductor device of claim 8, wherein the semiconductor package further comprises:
an interposer;
the logic die electrically connected to the power delivery device die stack; and
a mold layer at least partially encapsulating the logic die and the power delivery device die stack.

10. The semiconductor device of claim 9, wherein the power delivery device die stack is coupled to the interposer.

11. The semiconductor device of claim 9, wherein the power delivery device die stack is coupled to a carrier upon which the interposer is mounted.

12. The semiconductor device of claim 8, wherein the first power delivery device die and the second power delivery device die are both integrated passive device dies.

13. The semiconductor device of claim 8, wherein the first power delivery device die is a package integrated voltage regulator including multiple passive devices and the second power delivery device die is an integrated passive device die.

14. The semiconductor device of claim 8, wherein the first power delivery device die is a voltage regulator and the second power delivery device die is an integrated passive device die.

15. The semiconductor device of claim 14, wherein the first power delivery device die includes through-silicon vias.

16. The semiconductor device of claim 8, wherein one or more integrated passive device dies are stacked on the second power delivery device die.

17. The semiconductor device of claim 8, wherein the second power delivery device die is mounted on the first power delivery device die; and
    wherein the first power delivery device die and the second power delivery device die are mechanically and electrically connected through a hybrid metal and insulating bond.

18. A semiconductor device comprising:
    a power delivery device die stack including a plurality of vertically arranged power delivery device dies, the plurality of power delivery device dies including at least a first power delivery device die and a second power delivery device die electrically connected to the first power delivery device die, wherein the second power delivery device die is placed over the first power delivery device die, wherein the power delivery device die stack is configured to provide, from one or more circuits of the power delivery device stack, power for another die;
    at least one first external interconnect for providing a power input to the power delivery device die stack; and
    at least one second external interconnect, coupled to the one or more circuits, for supplying a power output from the power delivery device die stack for the another die.

19. The semiconductor device of claim 18, and further comprising:
    an electrical pathway between one or more passive devices in the first power delivery device die and one or more passive devices in the second power delivery device die.

20. The semiconductor device of claim 18, and further comprising:
    a third power delivery device die placed over the second power delivery device die; and
    an electrical pathway between the first power delivery device die, the second power delivery device die and the third power delivery device die.

* * * * *